United States Patent [19]

Boulitrop et al.

[11] Patent Number: 4,697,331
[45] Date of Patent: Oct. 6, 1987

[54] METHOD OF FABRICATION OF A CONTROL TRANSISTOR FOR A FLAT-PANEL DISPLAY SCREEN

[75] Inventors: François Boulitrop, Sceaux; Eric Chartier, Chatenay Mallabry; Bruno Mourey, Boulogne Billancourt; Serge Le Berre, Dampierre, all of France

[73] Assignee: Thomson-CSF, Paris, France

[21] Appl. No.: 900,079

[22] Filed: Aug. 25, 1986

[30] Foreign Application Priority Data

Aug. 27, 1985 [FR] France .................. 85 12804

[51] Int. Cl.⁴ .................. H01L 21/18; H01L 29/78; G09G 3/36
[52] U.S. Cl. .................. 437/82; 357/23.7; 350/336; 437/101; 437/245
[58] Field of Search .................. 350/333, 334, 335, 336, 350/331; 357/23.7, 2; 29/571, 572

[56] References Cited

U.S. PATENT DOCUMENTS

| | | | |
|---|---|---|---|
| 4,332,075 | 6/1982 | Ota et al. | 29/571 |
| 4,398,340 | 8/1983 | Brown | 29/571 |
| 4,413,883 | 11/1983 | Baraff et al. | 350/334 |
| 4,517,733 | 5/1985 | Hamano | 29/572 |
| 4,523,811 | 6/1985 | Ota | 350/333 |
| 4,543,320 | 9/1985 | Vijan | 357/23.7 |
| 4,547,789 | 10/1985 | Camella et al. | 357/2 |
| 4,582,395 | 4/1986 | Morozumi | 350/334 |
| 4,609,930 | 9/1986 | Yamazaki | 357/23.7 |
| 4,625,224 | 11/1986 | Nakagawa et al. | 357/23.7 |
| 4,633,284 | 12/1986 | Hansell et al. | 357/23.7 |
| 4,639,087 | 1/1987 | Cannella | 350/336 |

FOREIGN PATENT DOCUMENTS

2134685A 8/1984 United Kingdom .

OTHER PUBLICATIONS

*Proceeding of the SiD*, vol. 25/1, 1984, pp. 21-24, "A Self-Alignment Processed a-Si: H TFT Matrix Circuit for LCD Panels" by S. Kawai et al.

*Xerox Disclosure Journal*, vol. 9, No. 6, Nov./Dec. 1984, pp. 355-356, "Transparent Drain Pads for Liquid Crystal Displays" by W. G. Hawkins.

Primary Examiner—Brian E. Hearn
Assistant Examiner—Chi-Tso Huang
Attorney, Agent, or Firm—Oblon, Fisher, Spivak, McClelland & Maier

[57] ABSTRACT

A method of fabrication of a control transistor for a flat-panel display screen involves the following steps:
deposition of conductive material such as ITO on a substrate;
etching of electrodes in the conductive material;
successive depositions of layers formed of metallic material followed by n-doped amorphous semiconductor material;
etching of a column and a connecting element in contact with the electrode;
successive depositions of layers formed of undoped amorphous semiconductor material followed by insulating material and then by metallic material;
etching in the three layers which have just been deposited of a row which overlaps the column and the connecting element.

6 Claims, 13 Drawing Figures

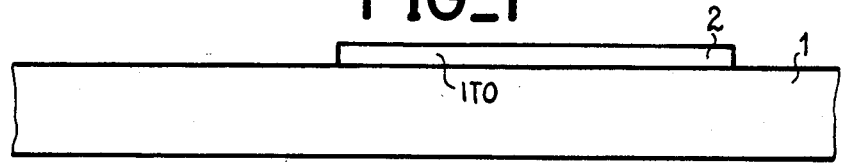
FIG_1
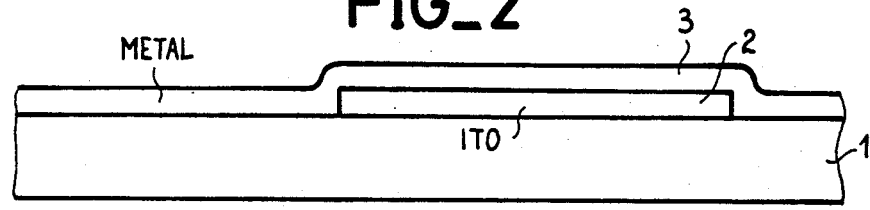
FIG_2
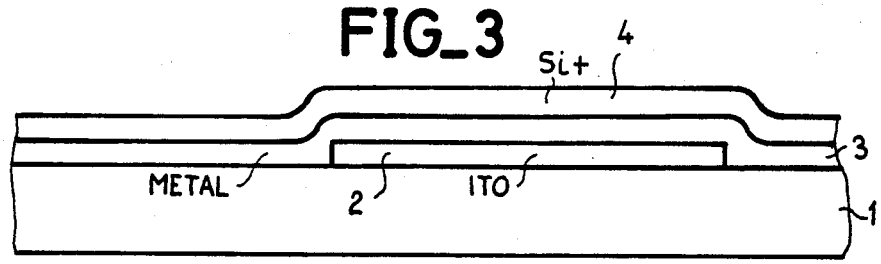
FIG_3
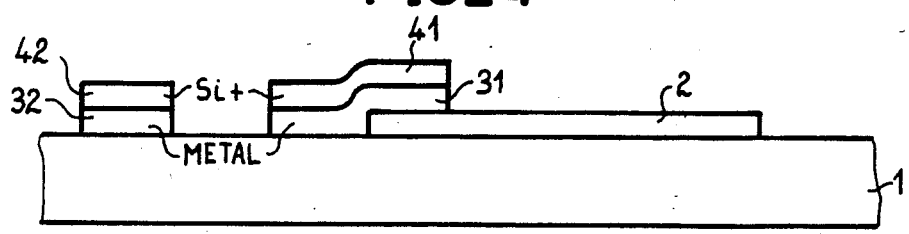
FIG_4
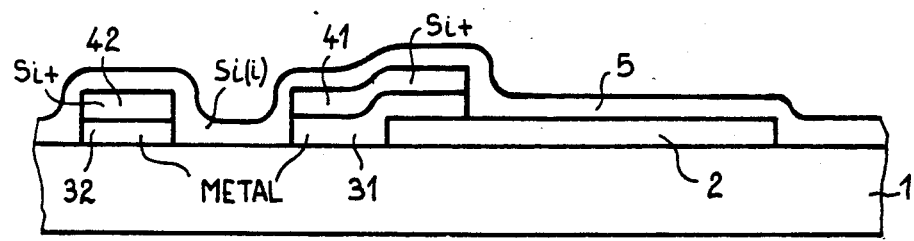
FIG_5

FIG_6
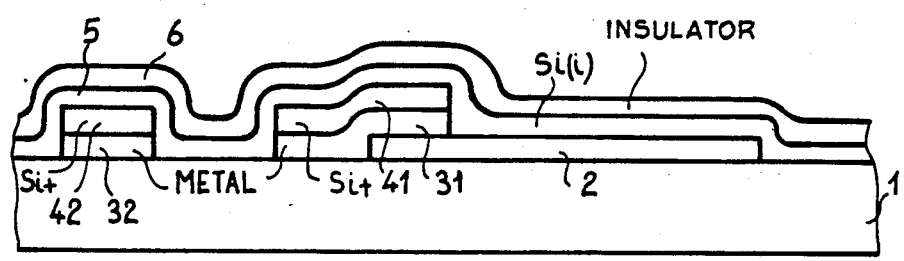
FIG_7
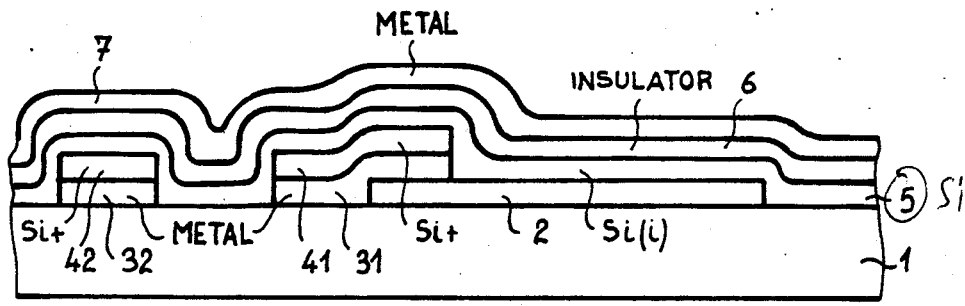

FIG_8
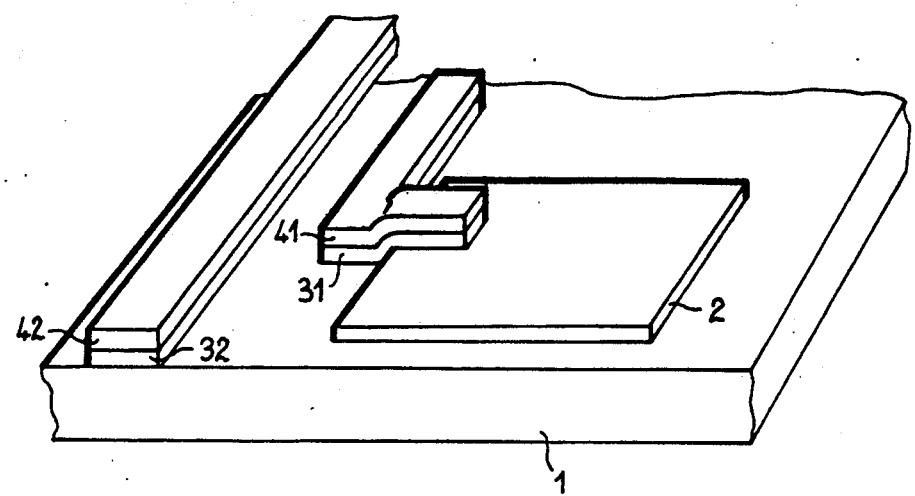
FIG_9
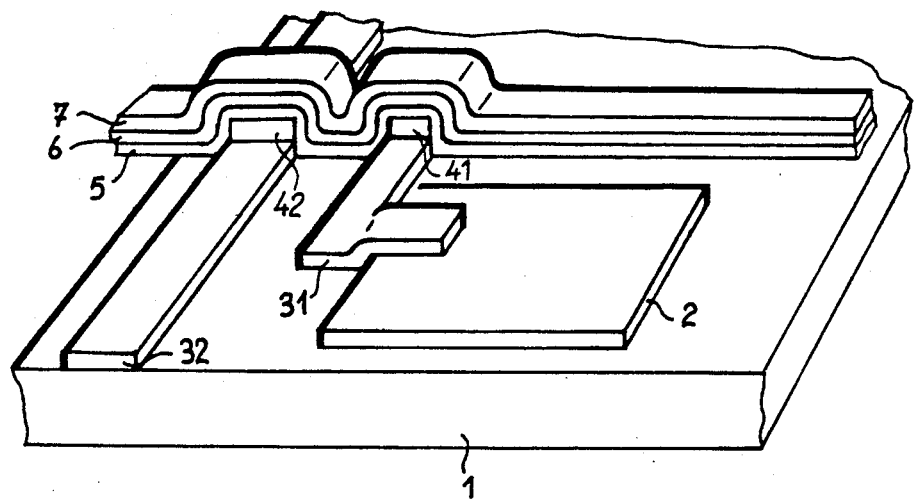

FIG_10
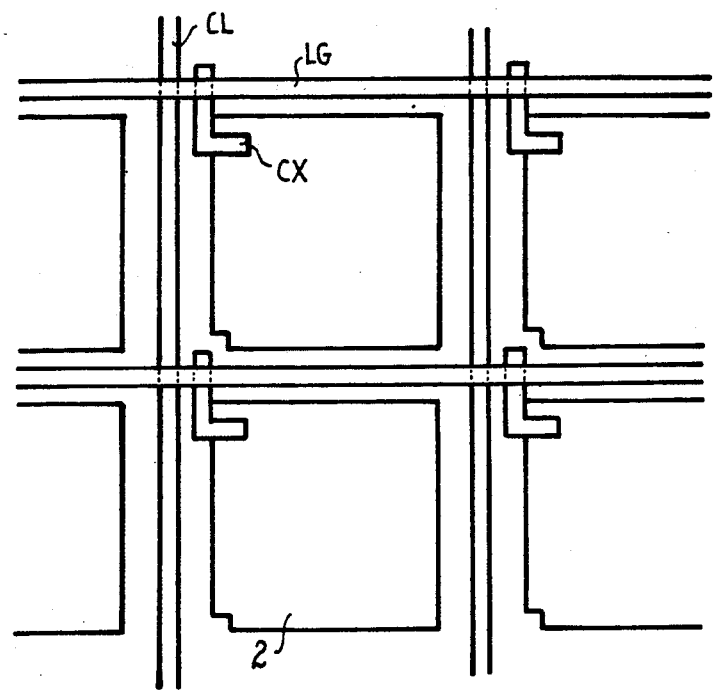
FIG_11
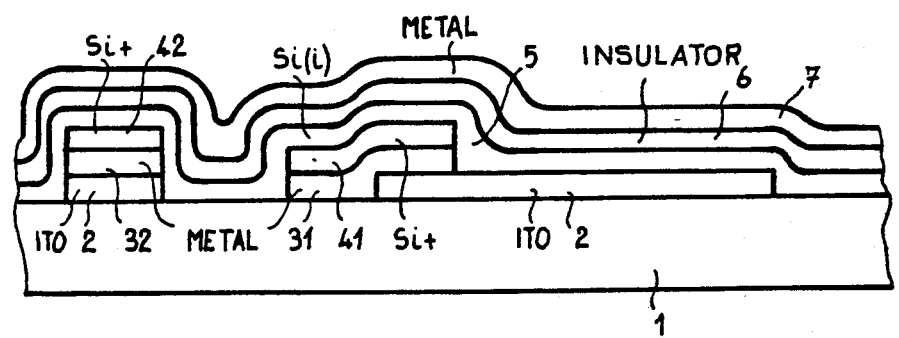

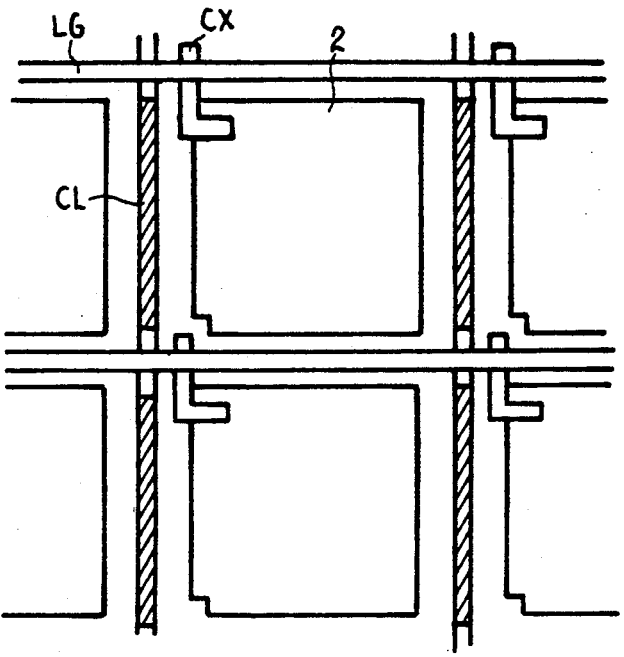
FIG_12
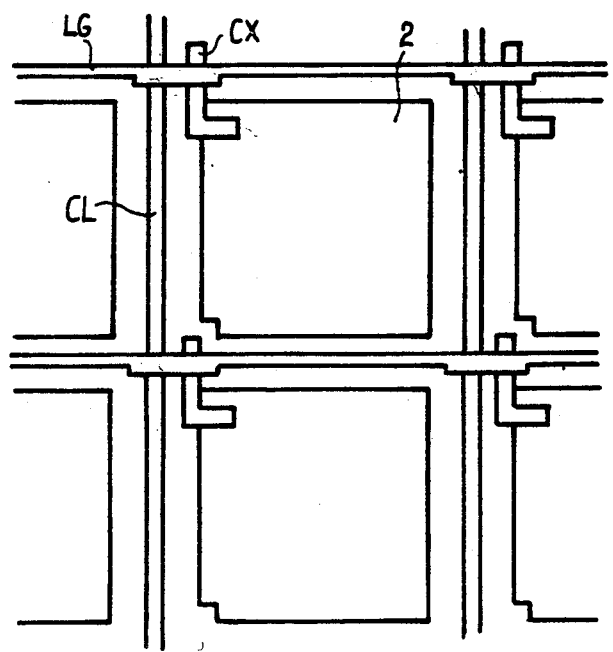
FIG_13

METHOD OF FABRICATION OF A CONTROL TRANSISTOR FOR A FLAT-PANEL DISPLAY SCREEN

BACKGROUND OF THE INVENTION

1. Field of the Invention

The present invention relates to a method of fabrication of a control transistor for an electrooptical flat-panel display screen and to a control transistor fabricated in accordance with said method. The invention is primarily applicable to the construction of large-area liquid crystal screens and more particularly to integration of control elements of the screen in the form of thin films.

2. Description of the Prior Art

As is already known, screens of this type usually have a large number of picture elements (pixels) of square or rectangular shape. These picture elements have to be addressed individually. The screen definition is a function of the number of elements which are capable of receiving an item of information. Control of each element is performed by applying an electric field through the liquid crystal. In order to meet video data display requirements, matrix-type displays have been proposed. In a display of this type, each picture element or so-called pixel is defined by the intersection of two orthogonol arrays of row and column leads.

Addressing of a pixel by means of control voltages applied to the row and column concerned does not need to be maintained if a time-multiplexing technique is adopted for refreshing the state of the screen by recurrence. This technique is based on a persistence effect which may be either physiological or available within the screen element.

Since the switching elements are addressed sequentially, one row after another, the number of rows which can thus be addressed is usually limited by the characteristics of the electrooptical effect of the liquid crystal employed. It is possible to address a large number of rows (>100) only at the expense of the other characteristics of the screen (reduction in contrast and increase in angular dependence). In order to improve the performance of these screens, a transistor or a nonlinear element can be placed in series with each pixel (which constitutes a capacitor). In such a case, the array behaves like a memory cell.

The present invention relates to a screen controlled by a matrix array of transistors and to a method for the construction of said screen.

In the field of display screens, current technical requirements are primarily centered on the achievement of higher image definition. In the case of screens of the matrix display type, there is consequently a design trend towards display devices having a large number of addressing rows or columns which can amount to as many as 512 or even 1024. This entails a corresponding increase in the number of control transistors. For the purposes of large-scale production, it is necessary in particular to obtain a high production yield, good reproducibility and high stability of these components. A further requirement is that the electrical capacitance of the component must be matched with that of the associated cell, also with good reproducibility.

The construction of a matrix array of thin-film transistors (TFT) usually calls for at least four photoetching steps (photolithographic technique) with high standards of positioning accuracy. These transistors are usually designed in a reverse-biased multistage structure.

In another known design, however, the transistor matrix array has a forward-biased multistage structure as described in the article entitled "Large LCD panel addressed by 320×320 TFT array" by J. Richard et al. published in Eurodisplay 84, Paris (1984). The technique described in this article makes it possible to limit the fabrication process to two photoetching steps but is subject to drawbacks such as columns of ITO which has higher resistivity than the metal and difficult etching of ITO which is in a totally oxidized state.

Some of these disadvantages have been solved by increasing the number of photoetching steps of five as described in the article entitled "A 31-inch a-Si TFT addressed color LCD" by Toshio Yanagisawa et al. published in Eurodisplay 84, Paris (1984).

The invention relates to a method which, while retaining the advantage of fabrication of transistors by means of two photoetching steps which do not entail the need for critical positioning, makes it possible to remove the disadvantages mentioned above and to suppress production constraints by adding only a third photoetching step for the fabrication of the screen as a whole.

SUMMARY OF THE INVENTION

The present invention therefore relates to a method of fabrication of a control transistor for a flat-panel display screen placed on a flat face of a substrate, the method being essentially carried out in the following successive steps:

(a) a first step which involves deposition of conductive material on the substrate;

(b) a second step which involves etch cutting of at least one control electrode in the layer of conductive material;

(c) a third step involving deposition of a first layer of metallic material;

(d) a fourth step involving deposition of an n-type doped amorphous semiconductor layer;

(e) a fifth step which involves etch cutting of at least one connecting element having a portion in contact with the electrode and of a column located in proximity to said connecting element in the layers of n-type doped amorphous semiconductor material and of metallic material deposited earlier;

(f) a sixth step involving deposition of a layer of undoped amorphous semiconductor material;

(g) a seventh step involving deposition of a layer of insulating material;

(h) an eighth step involving deposition of a second layer of metallic material;

(i) a ninth step which involves etch cutting of at least one row which overlaps the column and the connecting element in the layers of metallic material, of insulating material and of undoped amorphous semiconductor material.

The invention is also directed to a control transistor provided with at least one control electrode deposited on a substrate, the control transistor being essentially constituted by the following components: at least one connecting element having a first layer of metallic material deposited on the substrate and in contact with the control electrode and a layer of doped amorphous semiconductor material superposed on the previous layer; a column located in proximity to the connecting element, said column being provided with a layer of metallic material deposited on the substrate and a layer of doped amorphous semiconductor material deposited on the previous layer; a row in contact with the column and the connecting element having a layer of undoped amorphous semiconductor material which overlaps the row and the connecting element; an insulating layer and a layer of metallic material superposed on the previous layer.

BRIEF DESCRIPTION OF THE DRAWINGS

Other features of the invention will be more apparent to those versed in the art upon consideration of the following description and accompanying drawings, wherein:

FIGS. 1 to 7 show the different steps of the method in accordance with the invention;

FIG. 8 is a perspective view of the component obtained on completion of the step shown in FIG. 4;

FIG. 9 is a perspective view of the component obtained by means of the method in accordance with the invention;

FIG. 10 is a general view of a flat-screen control matrix obtained by means of the method in accordance with the invention;

FIGS. 11 and 12 illustrate an alternative embodiment of the invention;

FIG. 13 illustrates another alternative embodiment of the invention.

DETAILED DESCRIPTION OF THE INVENTION

Reference being made to FIGS. 1 to 7, the different steps of the method in accordance with the invention will now be described.

In a first step, there is deposited on a substrate 1 such as a glass plate a layer 2 of conductive material which can be a transparent material in the event of utilization in a display screen which operates in transparency. It will thus be possible to deposit a thin film of mixed indium-tin oxide (ITO) or an equivalent material (In$_2$O$_3$, SnO$_2$). A layer of this type will have a thickness within the range of 500 to 1500 Angstroms, a suitable value being 1250 Anstroms, for example, A glass substrate of this type covered with a partially oxidized layer of ITO is commerically available under the trade name of "Baltracon de Balzers", for example. The use of a substrate of this type makes it possible to dispense with this initial step of the method in accordance with the invention.

In a second step, the layer 2 of conductive material is etched in the cold state with a dilute acid so as to form on the surface of the substrate 1 and electrodes 2 such as the electrode which is illustrated in FIG. 1. The advantage of etching on material such as paritally oxidized ITO lies in the possiblity of employing a dilute acid whereas a totally oxidized ITO would entail the need for hot-state etching by means of a concentrated acid.

In the case of a partially oxidized ITO layer, the etching step is followed by a step of annealing in an ambient atmosphere in order to complete the oxidation of the layer.

In a third step of the process, a layer of a metal 3 such as chromium is deposited by vacuum evaporation or cathode sputtering. The thickness of the layer 3 must be of the order of a few hundred Angstroms, a suitable value being 600 Angstroms, for example. A structure as shown in FIG. 2 is thus obtained.

A fourth step involves deposition of a heavily doped n-type layer 4 of semiconductor material such as amorphous silicon. This deposition operation is carried out by a known method of deposition of amorphous silicon such as luminescent discharge or reactive sputtering. The thickness of this layer will be approximately 400 Angstroms. A structure of the type shown in FIG. 3 is thus obtained.

A fifth step involves etching of the two layers previously deposited (amorphous silicon layer 4 and metal layer 3) in order to form connecting elements CX and columns CL as shown in FIG. 4. The connecting element CX is formed by a layer 31 and a layer 41 etched in the layers 3 and 4 of FIG. 3. Similarly, the column CL is constituted by a layer 32 and a layer 42 etched in the layers 3 and 4.

FIG. 8 provides a perspective view of the structure thus obtained. The connecting element CX has the general shape of an L. One of the arms of the L is in contact with the electrode 2 whilst the other arm of the L is parallel to the column CL.

This etching step is performed by the photolithographic or photoetching technique and alone serves to define the geometry of the transistor (size of transistor channel).

A sixth step involves deposition of a layer 5 of semiconductor material such as undoped amorphous silicon. This deposition is performed by a known method such as luminescent discharge or reactive sputtering. The thickness of the layer obtained is approximately 3000 Angstroms. The assembly thus obtained is shown in FIG. 6.

A seventh step involves deposition of a layer 6 of insulator material (gate insulator) by a method similar to that of the preceding sixth step. The thickness of the insulator layer 6 is approximately 1500 Angstroms. The insulator material employed can be a nitride, for example.

An eighth step involves deposition of a layer 7 of metallic material such as aluminum and the like. The method of deposition of this layer will be similar to that of the third step of deposition of layer 3. The thickness of layer 7 will be approximately 3000 Angstroms.

A ninth step involves etching of the metal layer 7, the insulator layer 6 and the silicon layer 5 as shown in FIG. 7 in order to obtain row LG. The doped silicon of the columns and connecting elements remains only at the points of intersection with the rows.

In the perspective view of FIG. 9, there can be seen a row LG which is perpendicular to the column CL as well as a portion of the connecting element CX. This etching operation is carried out by the photolithographic process.

At this stage, integrated control is performed as illustrated in FIG. 10. The substrate 1 which carries electrodes of the rows LG, of the columns CL and of the connecting elements CX at their points of intersection can be employed for the construction of a liquid crystal screen in accordance with known technologies. As has already been demonstrated by practical experience, it will thus prove advisable to provide:

an anchoring layer (polyimide, SiO, and so on);

spacers or shims having the function of forming a space for containing the liquid crystal;

a transparent counter-electrode with an anchoring layer.

The liquid crystal will then be contained between the electrode 2 and a counter-electrode (not shown in the drawings). It will be possible, for example, to observe the liquid crystal between crossed polarizers in the case of a twisted nematic cell.

In accordance with the invention, a column CL in which a metal layer 32 has higher conductivity than ITO makes it possible to avoid the effects of delay lines in large-area screens.

In order to prevent the occurrence of breaks in columns and in order to increase the production yield when carrying out the method in accordance with the invention, the second step of the process described in the foregoing includes an operation in which columns of ITO material are also etched along the entire length of the future columns except at the control transistor locations. As shown in FIGS. 11 and 12, a column CL will have a sublayer of ITO over a distance corresponding to the portion shown in hatching lines in FIG. 12.

Moreover, as illustrated in FIG. 13, each row LG can be provided with a widened portion at the level of each point of intersection (transistor). This makes it possible to reduce the parasitic transistor effect which may exist between the drain of the principal transistor and the following column.

It should be added that the layers of amorphous silicon 5 and of insulating material 6 deposited during the sixth and seventh steps described earlier can be deposited through a mask which serves to isolate the periphery of the substrate 1 from these deposits. Thus the peripheral contacts of each row LG are formed directly on the substrate by the deposited metal layer 7.

A final point worthy of note is that the amorphous silicon deposited in the sixth step can be electrically compensated or even lightly p-doped in order to reduce photoconductivity and thus to limit the influence of light on the transistor characteristics.

What is claimed is:

1. A method of fabrication of a control transistor for a flat-panel display screen placed on a substrate, comprising the following successive steps:
   (a) a first step which involves deposition of conductive material on the substrate;
   (b) a second step which involves etch cutting of at least one control electrode in the layer of conductive material;
   (c) a third step involving deposition of a first layer of metallic material;
   (d) a fourth step involving deposition of an n-type doped amorphous semiconductor layer;
   (e) a fifth step which involves etch cutting of at least one connecting element having a portion in contact with the electrode and of a column located in proximity to said connecting element in the layers of n-type doped amorphous semiconductor material and of metallic material deposited earlier;
   (f) a sixth step involving deposition of a layer of undoped amorphous semiconductor material;
   (g) a seventh step involving deposition of a layer of insulating material;
   (h) an eighth step involving deposition of a second layer of metallic material;
   (i) a ninth step which involves etch cutting of at least one row which overlaps the column and the connecting element in the layers of metallic material, of insulating material and of undoped amorphous semiconductor material.

2. A method according to claim 1, wherein the material deposited on the substrate during the first step is a partially oxidized metal oxide, wherein the etch cutting operation of the second step is performed with a dilute acid and wherein the second step is completed by an annealing step carried out in the surrounding air in order to achieve complete oxidation of the metal oxide layer.

3. A method according to claim 1, wherein the second step which involves etch cutting of at least one control electrode also involves etch cutting of portions of column.

4. A method according to claim 1, wherein deposition of semiconductor and insulator layers in the sixth and seventh steps is performed through a mask which preserves the periphery of the substrate so as to ensure that the metallic rows deposited during subsequent steps produce contacts which are located directly on the substrate.

5. A method according to claim 1, wherein the deposit of amorphous silicon formed in the sixth step is electrically compensated in order to reduce photoconductivity.

6. A method according o claim 1, wherein the amorphous silicon deposited in the sixth step is lightly p-type doped in order to reduce photoconductivity.

* * * * *